(12) United States Patent
Jang et al.

(10) Patent No.: US 9,054,131 B2
(45) Date of Patent: Jun. 9, 2015

(54) VERTICAL MOSFET ELECTROSTATIC DISCHARGE DEVICE

(75) Inventors: Jeng-Hsing Jang, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 152 days.

(21) Appl. No.: 13/281,293

(22) Filed: Oct. 25, 2011

(65) Prior Publication Data

US 2013/0099309 A1    Apr. 25, 2013

(51) Int. Cl.
| | |
|---|---|
| *H01L 29/78* | (2006.01) |
| *H01L 21/336* | (2006.01) |
| *H01L 29/66* | (2006.01) |
| *H01L 27/02* | (2006.01) |
| *H01L 21/8234* | (2006.01) |
| *H01L 29/423* | (2006.01) |
| *H01L 29/06* | (2006.01) |

(52) U.S. Cl.
CPC ... *H01L 29/66666* (2013.01); *H01L 21/823487* (2013.01); *H01L 27/0266* (2013.01); *H01L 29/4238* (2013.01); *H01L 29/7827* (2013.01); H01L 29/0692 (2013.01); H01L 2924/0002 (2013.01)

(58) Field of Classification Search
CPC .............. H01L 12/006; H01L 29/4238; H01L 29/0692; H01L 2924/0002
USPC .......... 257/328, 355, 365, 401, 330, E29.258, 257/192
See application file for complete search history.

(56) References Cited

U.S. PATENT DOCUMENTS

| | | | | |
|---|---|---|---|---|
| 5,955,763 | A * | 9/1999 | Lin ................................ | 257/355 |
| 6,365,932 | B1 * | 4/2002 | Kouno et al. ................. | 257/341 |
| 6,979,869 | B2 * | 12/2005 | Chen et al. .................... | 257/356 |
| 7,468,617 | B1 | 12/2008 | Sengupta et al. | |
| 7,982,264 | B2 * | 7/2011 | Izumi ............................ | 257/330 |
| 8,217,457 | B1 * | 7/2012 | Sengupta et al. ............. | 257/355 |
| 2001/0023957 | A1 * | 9/2001 | Warwick ....................... | 257/301 |
| 2006/0124994 | A1 * | 6/2006 | Jang et al. ..................... | 257/328 |
| 2010/0237414 | A1 * | 9/2010 | Hsieh ............................ | 257/337 |
| 2011/0084335 | A1 * | 4/2011 | Lin et al. ....................... | 257/334 |
| 2012/0007207 | A1 * | 1/2012 | Salcedo ........................ | 257/491 |
| 2012/0086080 | A1 * | 4/2012 | Chen et al. .................... | 257/355 |

* cited by examiner

*Primary Examiner* — Bradley K Smith
*Assistant Examiner* — David Goodwin (57) ABSTRACT

A vertical MOSFET electrostatic discharge device is disclosed, including a substrate comprising a plurality of trenches, a recessed gate disposed in each trench, a drain region disposed between each of the two neighboring recessed gates, an electrostatic discharge implant region disposed under each drain region, and a source region surrounding and disposed under the recessed gates and the electrostatic discharge implant regions.

11 Claims, 12 Drawing Sheets

VERTICAL MOSFET ELECTROSTATIC DISCHARGE DEVICE

BACKGROUND OF THE INVENTION

1. Field of the Invention

The present invention relates generally to integrated circuits and more particularly to protection for integrated circuits from transient electrostatic discharge (ESD).

2. Description of the Related Art

Electrostatic discharge (ESD) may cause damage to semiconductor devices on an integrated circuit during handling of the integrated circuit chip package. Specifically, integrated circuits are susceptible to electrostatic discharge (ESD) events that can either degrade the performances of circuits or may destroy them. Prevention of such damage generally is provided by protection circuits incorporated into the chip of the integrated circuit. In general, such protection circuits include a switch which is capable of conducting relatively large currents during an ESD event. Decreasing the size of the ESD protection circuitry while maintaining its performance would be desirable to increase integration or increase margins of integrated circuits.

Figure 1A:
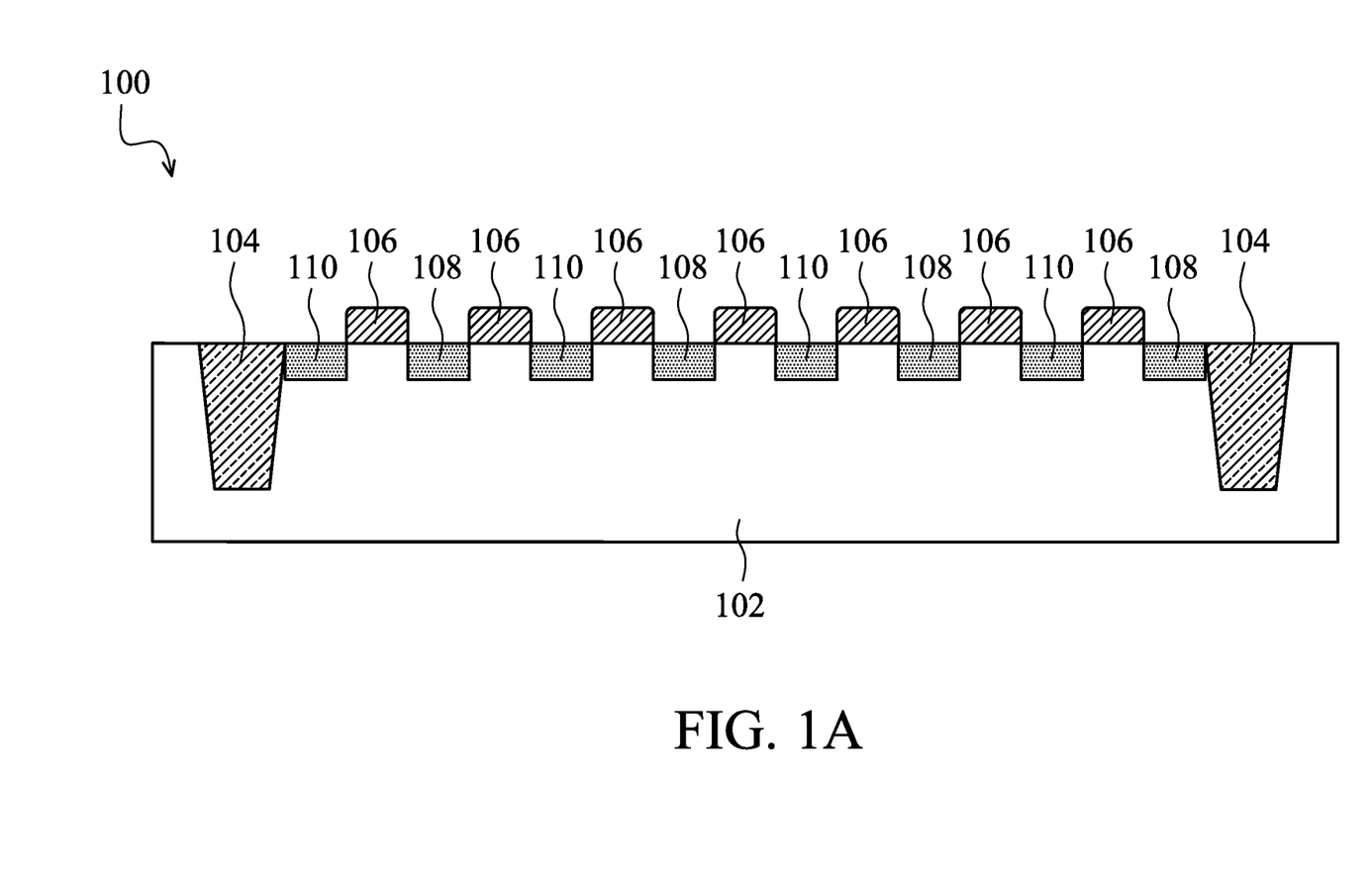
FIG. 1A shows a cross section of a MOSFET to address electrostatic discharge (ESD) events.
Figure 1B:
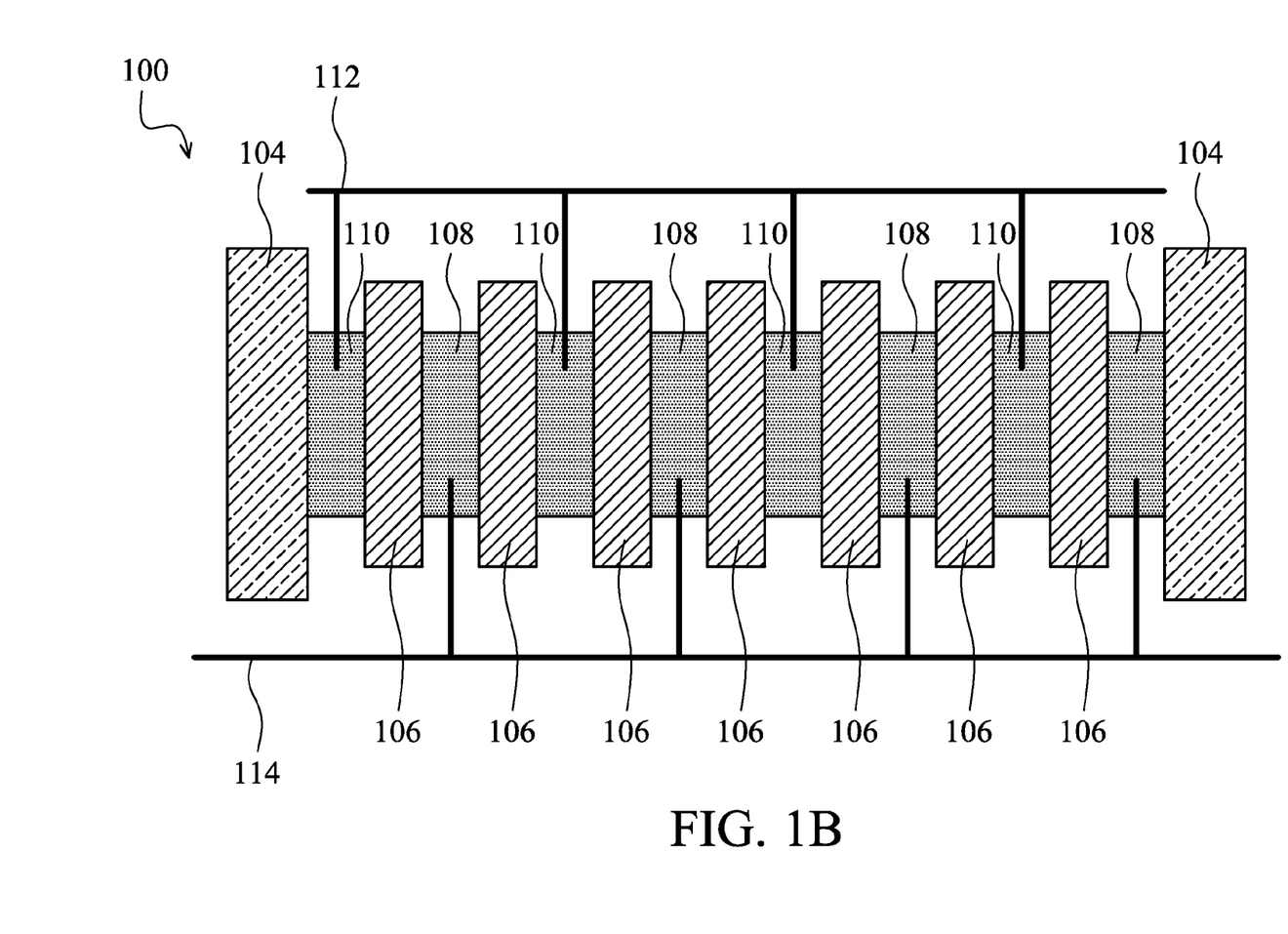
FIG. 1B shows a top view of a MOSFET to address electrostatic discharge (ESD) events.

FIG. 1A shows a cross section of a MOSFET to address electrostatic discharge (ESD) events. FIG. 1B shows a top view of FIG. 1A. Referring to FIGS. 1A and 1B, the ESD protection device 100 comprises a substrate 102 with trench isolations 104. A plurality of gates 106 are formed on the substrate 102 with a source region 110 and a drain region 108 disposed on opposite sides of each of the plurality of gates 106. A source contact 112 and a drain contact 114 alternatively contact the source regions 110 and the drain regions 108 (see FIG. 1B). The MOSFET device needs a large area to address high ESD, which hinders shrinkage for ESD design.

BRIEF SUMMARY OF INVENTION

The invention provides a vertical MOSFET electrostatic discharge device, comprising a substrate comprising a plurality of trenches, a recessed gate disposed in each trench, a drain region disposed between each of the two neighboring recessed gates, an electrostatic discharge implant region disposed under each drain region, and a source region surrounding and disposed under the recessed gates and the electrostatic discharge implant regions.

The invention further discloses a method for forming a vertical MOSFET electrostatic discharge device, comprising: providing a substrate; forming a plurality of trench isolations in the substrate; etching the substrate to form a plurality of trenches; forming a gate dielectric layer in each trench; forming a gate electrode layer in each trench to form recess gates; performing an ion implanting step to form a drain region between each of the two neighboring recessed gates; performing another ion implanting step to form an electrostatic discharge implant region under each drain region; and performing yet another ion implanting step to form a source region surrounding and disposed under the recessed gates and the electrostatic discharge implant regions.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Figure 2:
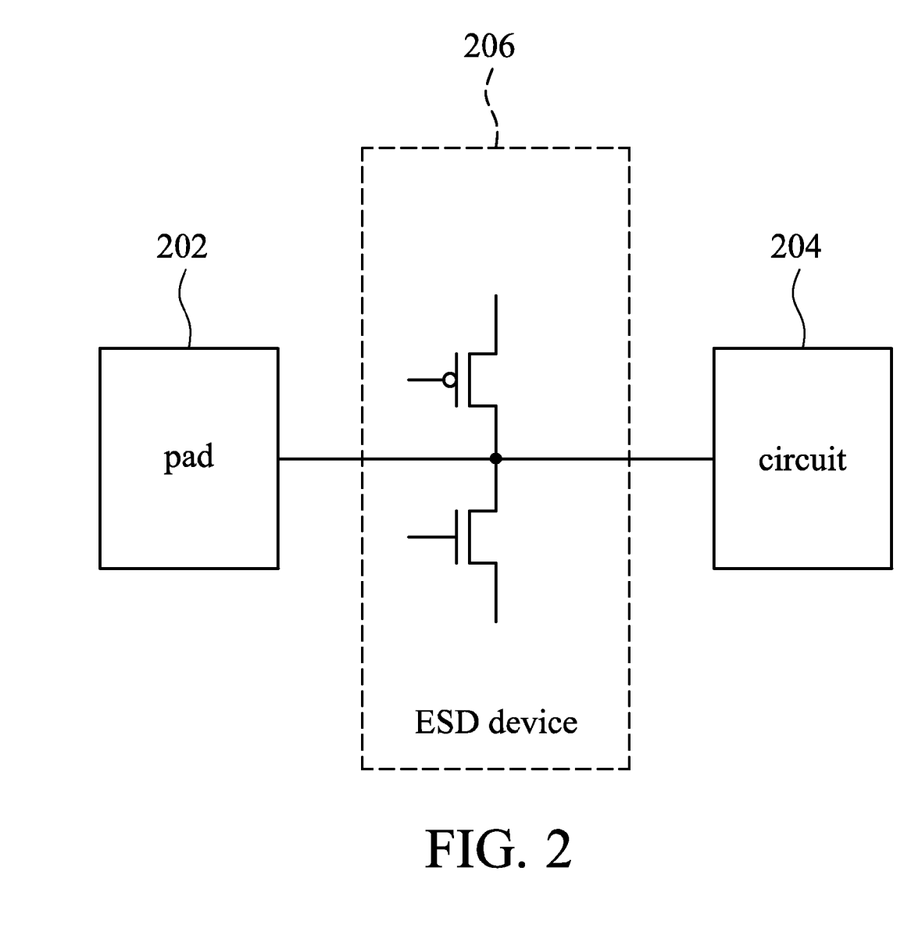
FIG. 2 shows a circuit diagram of the ESD MOSFET of an embodiment of the invention.

FIG. 2 shows a circuit diagram of the ESD MOSFET of an embodiment of the invention. In the embodiment, the ESD device 206 is formed as a vertical device between a pad 202 and a circuit 204 to address electrostatic discharge (ESD).

Figure 3A:
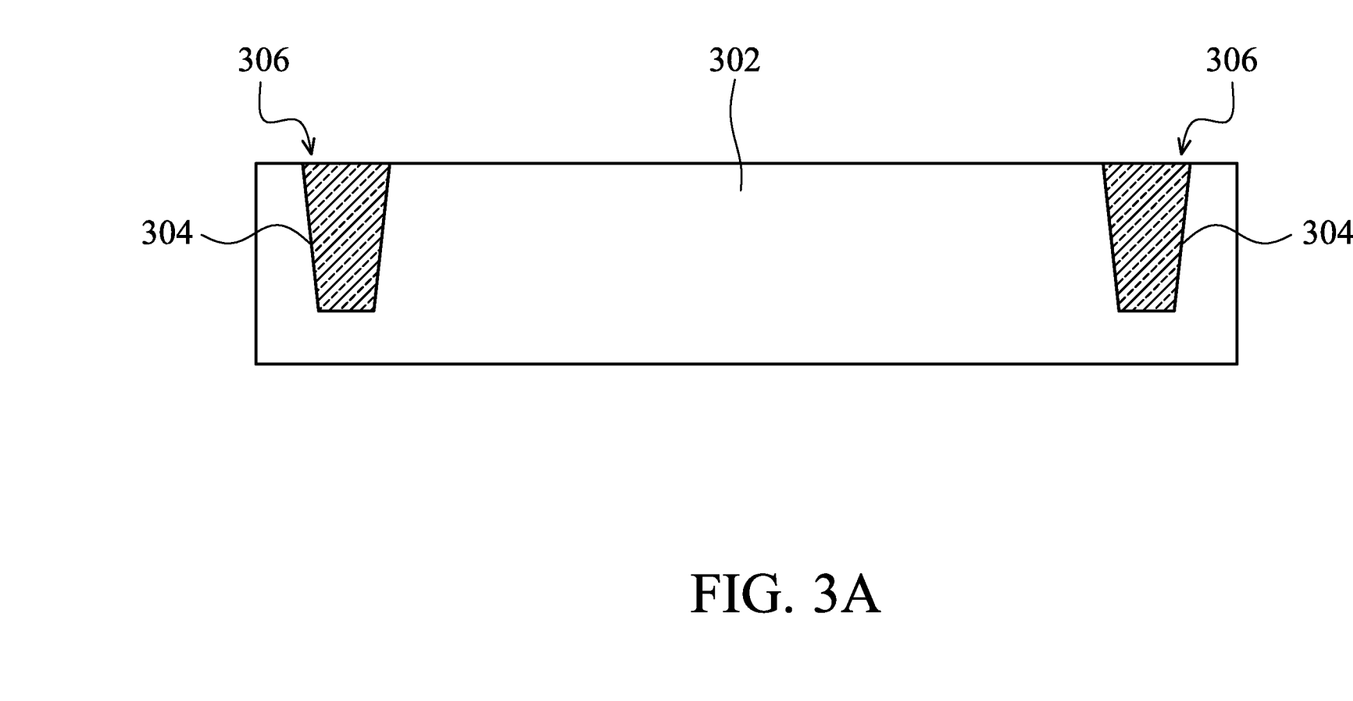
FIG. 3A-FIG. 3E shows cross sections of stages of a method for forming a vertical-arranged MOSFET for addressing electrostatic discharge (ESD) of an embodiment of the invention.

FIG. 3A-FIG. 3D shows cross sections of stages of a method for forming a vertical-arranged MOSFET for addressing electrostatic discharge (ESD) of an embodiment of the invention. Referring to FIG. 3A, a substrate 302 is provided. The substrate 302 may comprise silicon, gallium arsenide, gallium nitride, strained silicon, silicon germanium, silicon carbide, diamond, an epitaxy layer, and/or other materials. In a preferred embodiment of the invention, the substrate 302 is formed of silicon. A plurality of first trench isolations 306 and second trench isolations (not shown in FIG. 3A) are formed in the substrate 302. In an embodiment, the trench isolations can be formed by the following steps. First, a lithography and an etching process are performed to define the substrate 302 to form first trenches 304. Next, insulating material is deposited to be filled into the first trenches 304 and deposited on the substrate 302. Thereafter, the insulating material is etched back to remove portions of the insulating material overlying the substrate 302 top surface.

Figure 3B:
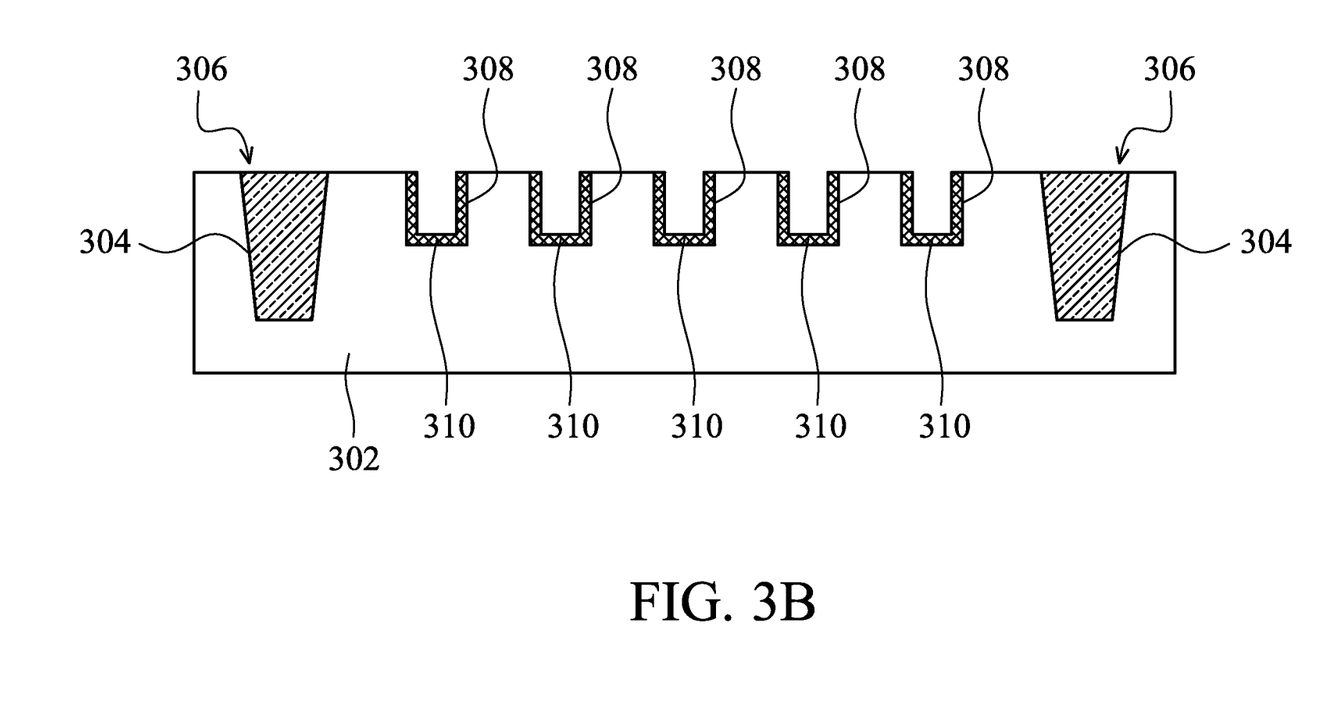
Figure 3C:
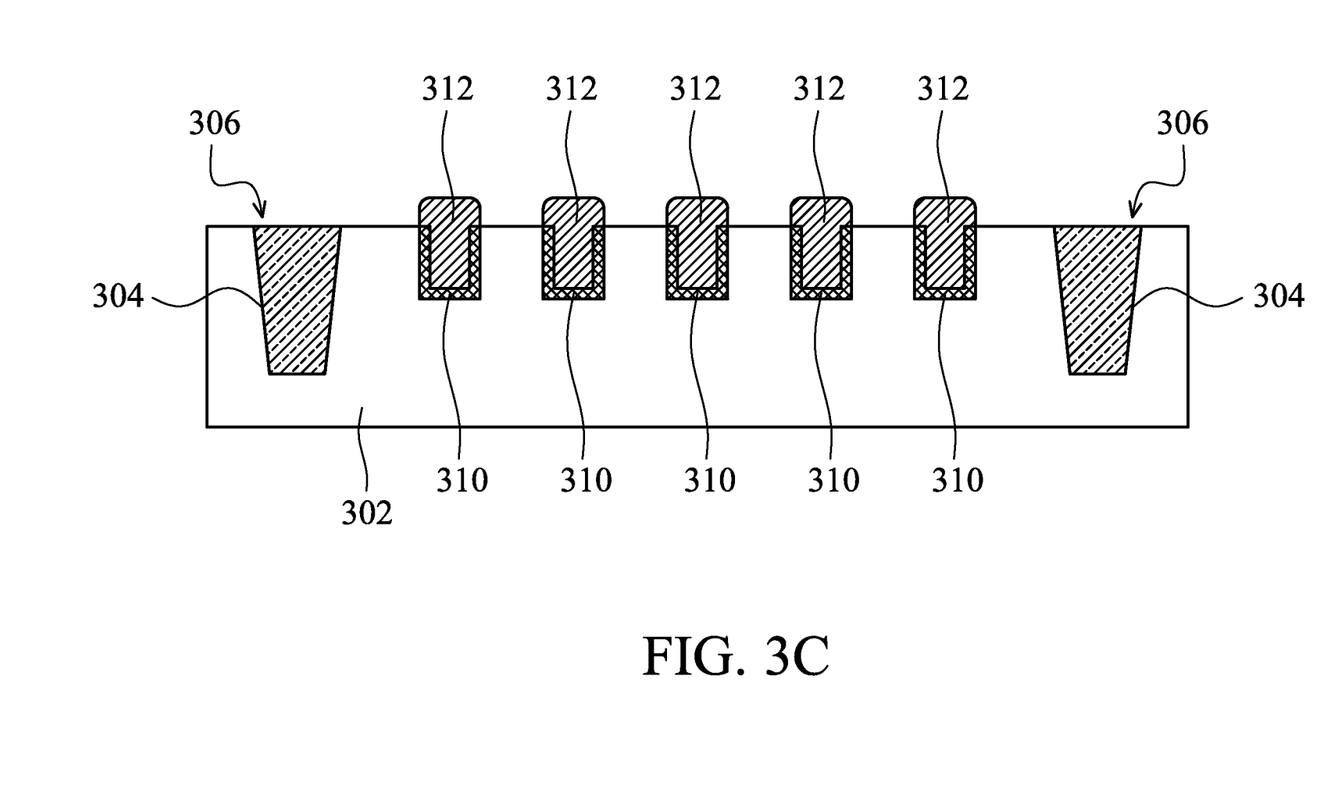

Referring to FIG. 3B, another lithography and etching process is performed to define the substrate 302 to form a plurality second trenches 308 for forming recess gates in subsequent processes. Next, a deposition process is performed to form a gate dielectric layer 310 in the first trenches 304 and on the substrate 302. Thereafter, an etching back or CMP process is performed to remove a portion of the gate dielectric layer 310 out of the second trenches 308. The gate dielectric layer 310 may comprise silicon oxide, silicon nitride, silicon oxynitride, or high dielectric constant materials, such as $Ta_2O_5$, $HfO_2$, $HSiO_x$, $Al_2O_3$, $InO_2$, $La_2O_3$, $ZrO_2$, and $TaO_2$. Referring to FIG. 3C, a gate electrode layer (not shown) is deposited on the substrate 302 and into the second trenches 308, and then a lithography and etching process is performed to form recess gates 312 in the second trenches 308. In an embodiment, the recess gates can be formed of poly silicon or metal, such as tungsten, titanium, tantalum, or combination thereof.

Figure 3D:
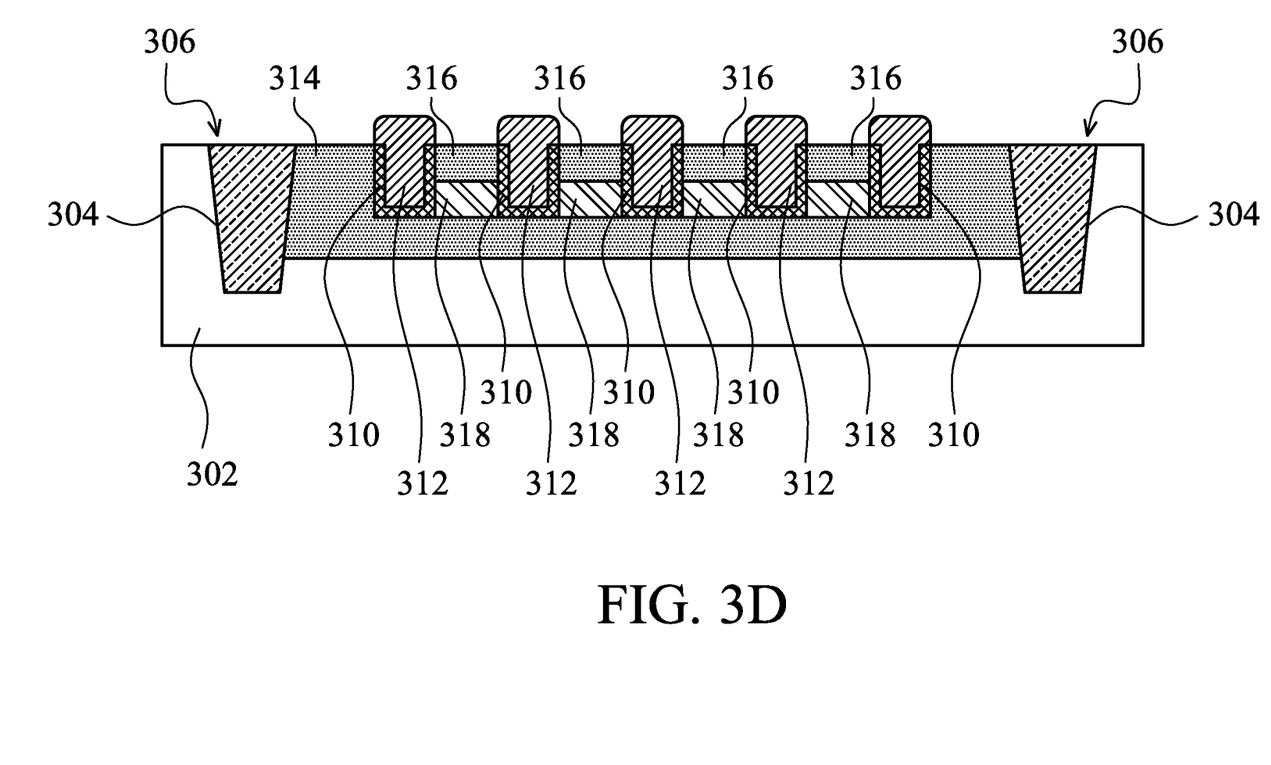
Figure 4:
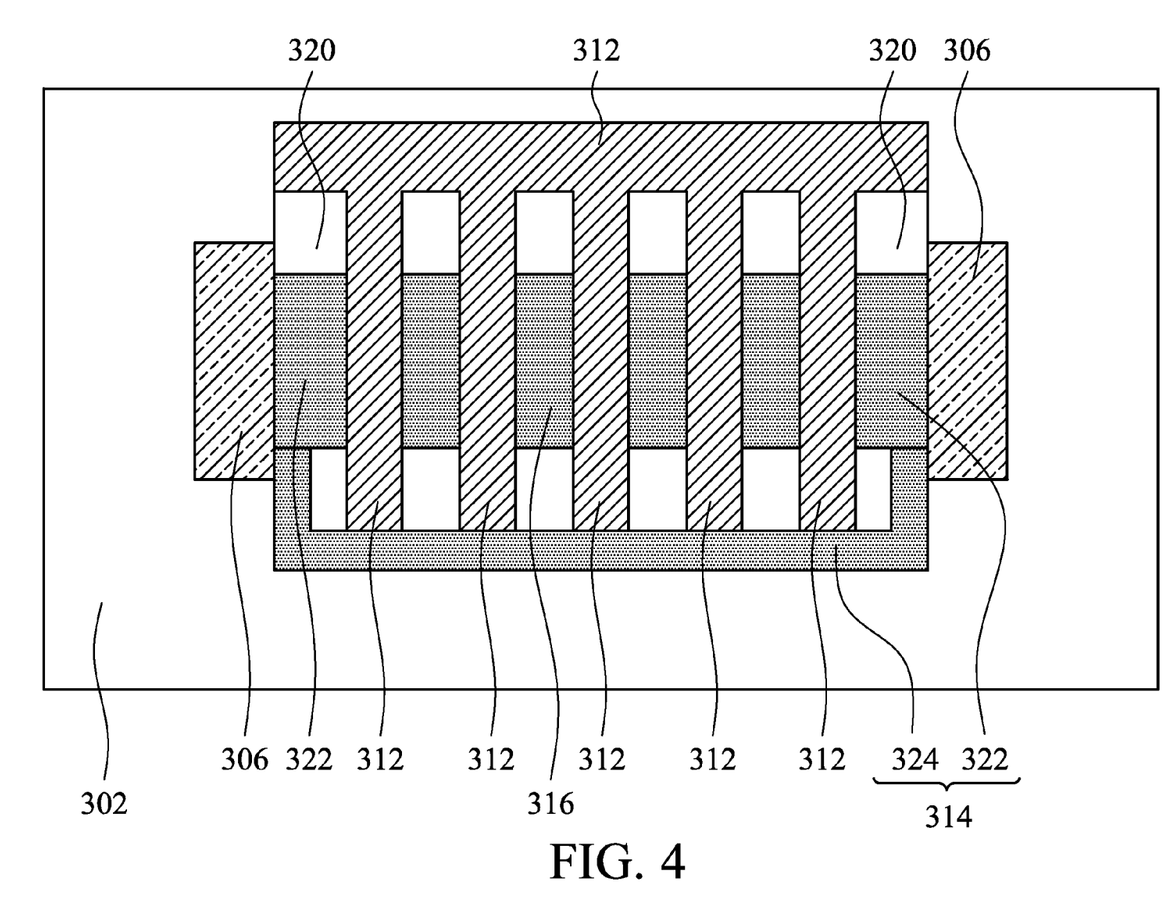
FIG. 4 shows a top view of a stage of method for forming a vertical-arranged MOSFET for addressing electrostatic discharge (ESD).

FIG. 3D show a cross section of a stage next after the stage of FIG. 3C of a method for forming a vertical-arranged MOSFET for addressing electrostatic discharge (ESD). FIG. 4 shows a top view of FIG. 3D. In FIG. 3D and FIG. 4, wherein a plurality of ion implantation process steps are performed to form a drain region 316 between neighboring recess gates 312, an ESD implant region 318 under each drain region 316 and a source region 314 surrounding the drain regions 316 and under the recess gates 312 and the ESD implant region 318. In more detail, the recess gate 312 is a comb-like structure, the drain regions 316 are disposed between two recess gates 312, and the source region 314 is U-shaped from the top view with a first portion 322 adjacent to the right most and left most recess gates 312 and a second portion 324 neighboring the sides of the recess gates 312 (see FIG. 4). The first trench isolations 306 are adjacent to two sides the source region 314, and the second trench isolations 320 are disposed neighboring opposite ends of each of the drain regions 316. In an embodiment, the source region 314 is doped with first type dopants, and the drain regions 316 are doped with first type dopants, and the ESD implant regions 318 are doped with second type dopants. In an embodiment, the first type is n-type, the second type is p type, wherein the first type dopants are phosphorous and the second type dopants are boron. In another embodiment, the first type is p-type, and the second type is n-type, wherein the first-type dopants are boron and the second type dopants are phosphorous.

Figure 3E:
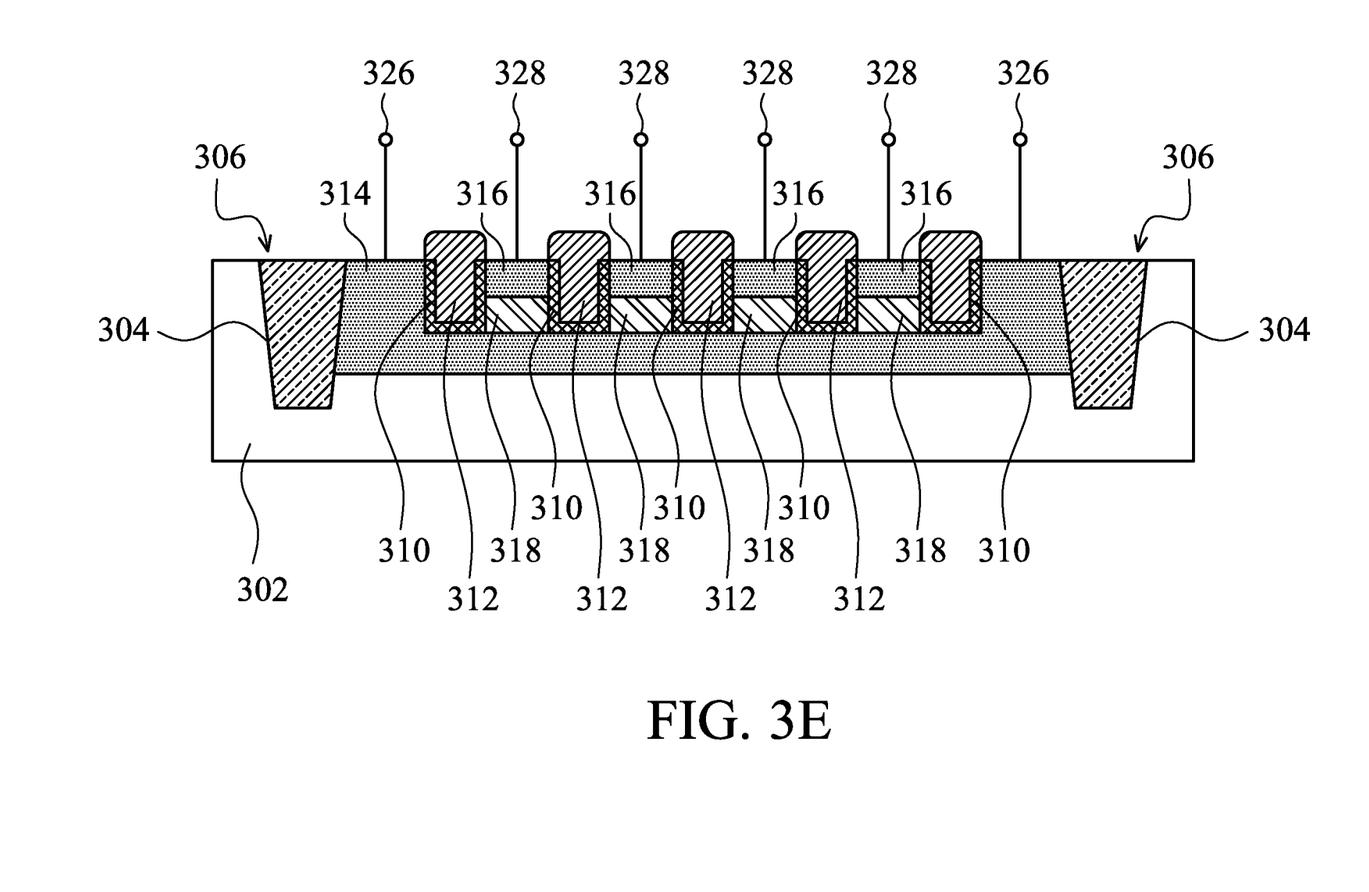
Figure 5:
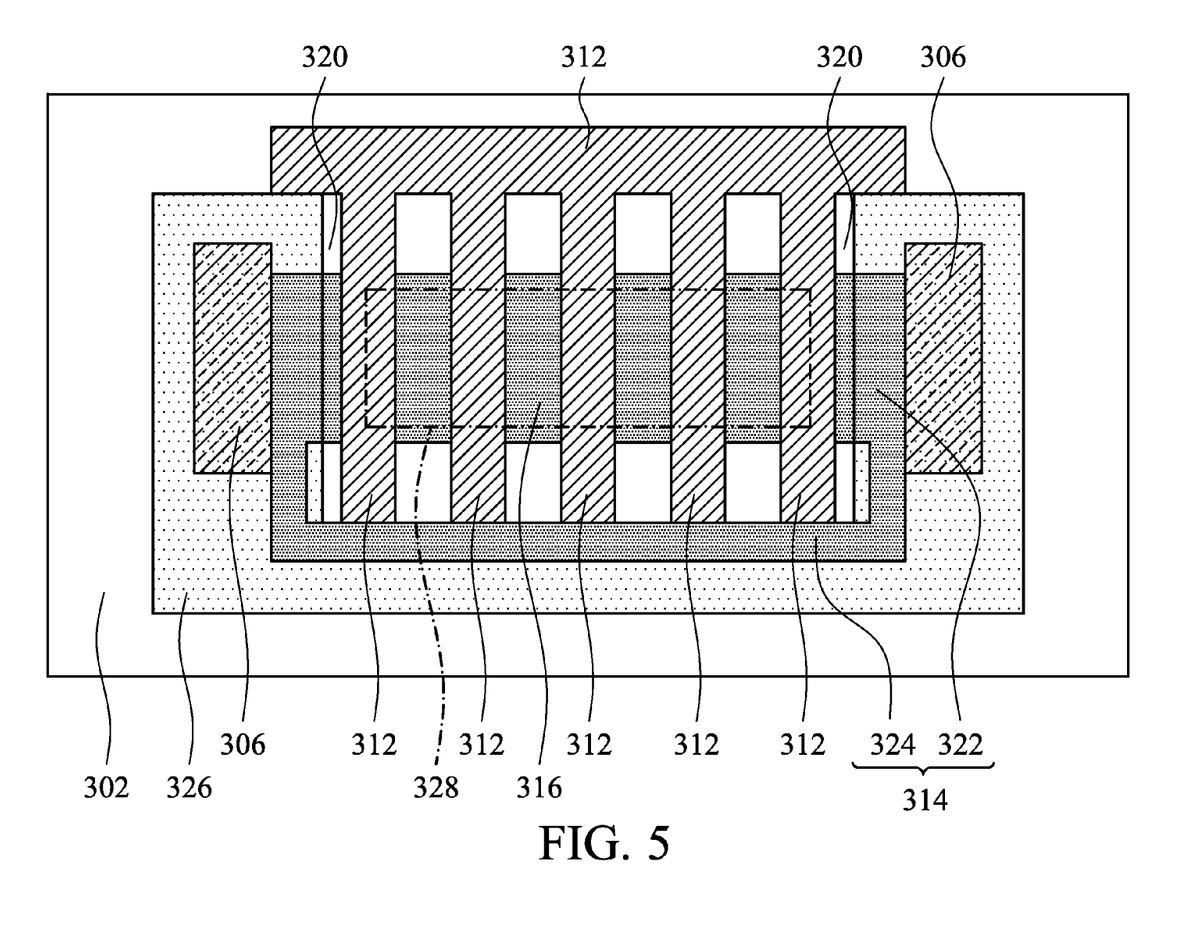
FIG. 5 shows a top view of a stage of method for forming a vertical-arranged MOSFET for addressing electrostatic discharge (ESD).

FIG. 3E show a cross section of a stage next to the stage of FIG. 3D of a method for forming a vertical-arranged MOSFET for addressing electrostatic discharge (ESD). FIG. 5 shows a top view of FIG. 3E. In FIG. 3E and FIG. 5, source contacts 326 are formed to electrically contact the source region 314 of the vertical MOSFET ESD device, and drain contacts 328 are formed to electrically contact the drain regions 316 of the vertical MOSFET ESD device.

Figure 6A:
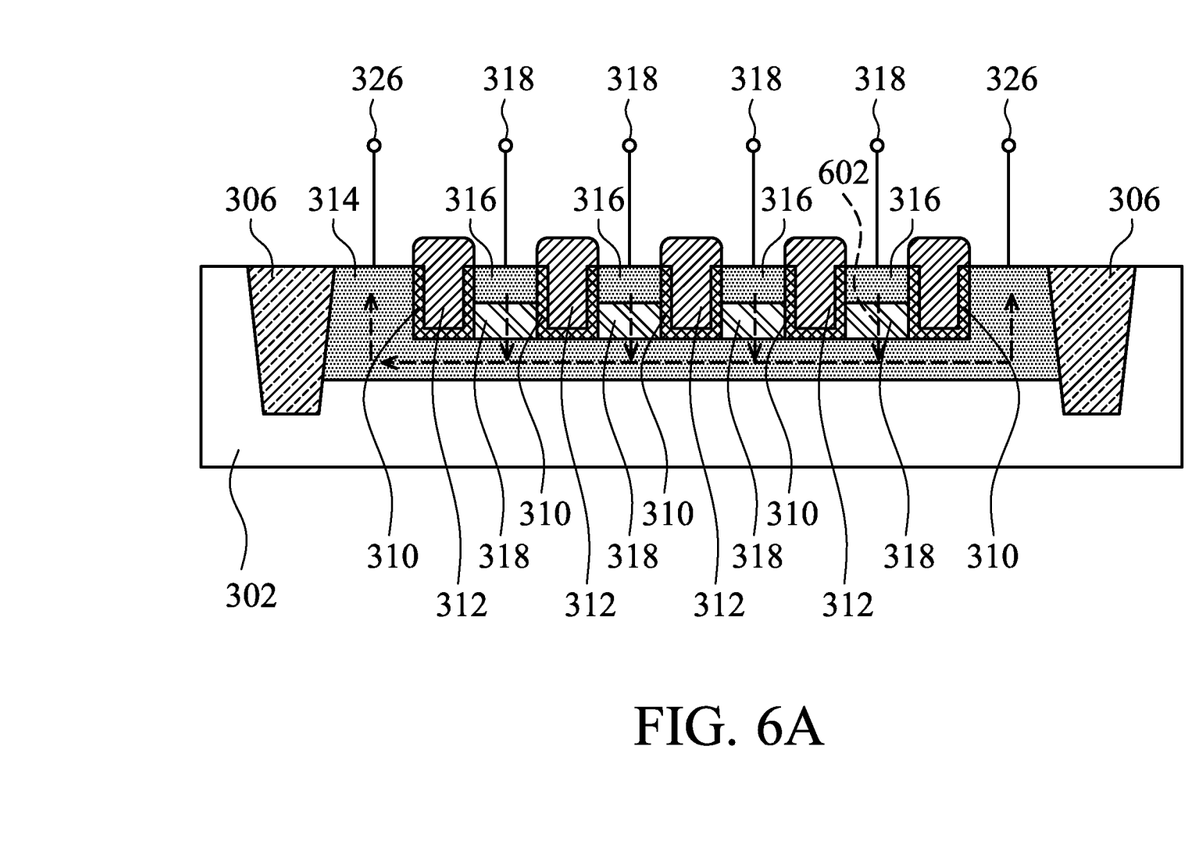
FIG. 6A and FIG. 6B show cross sections to illustrate the current flow of the vertical MOSFET ESD device of an embodiment of the invention.
Figure 6B:
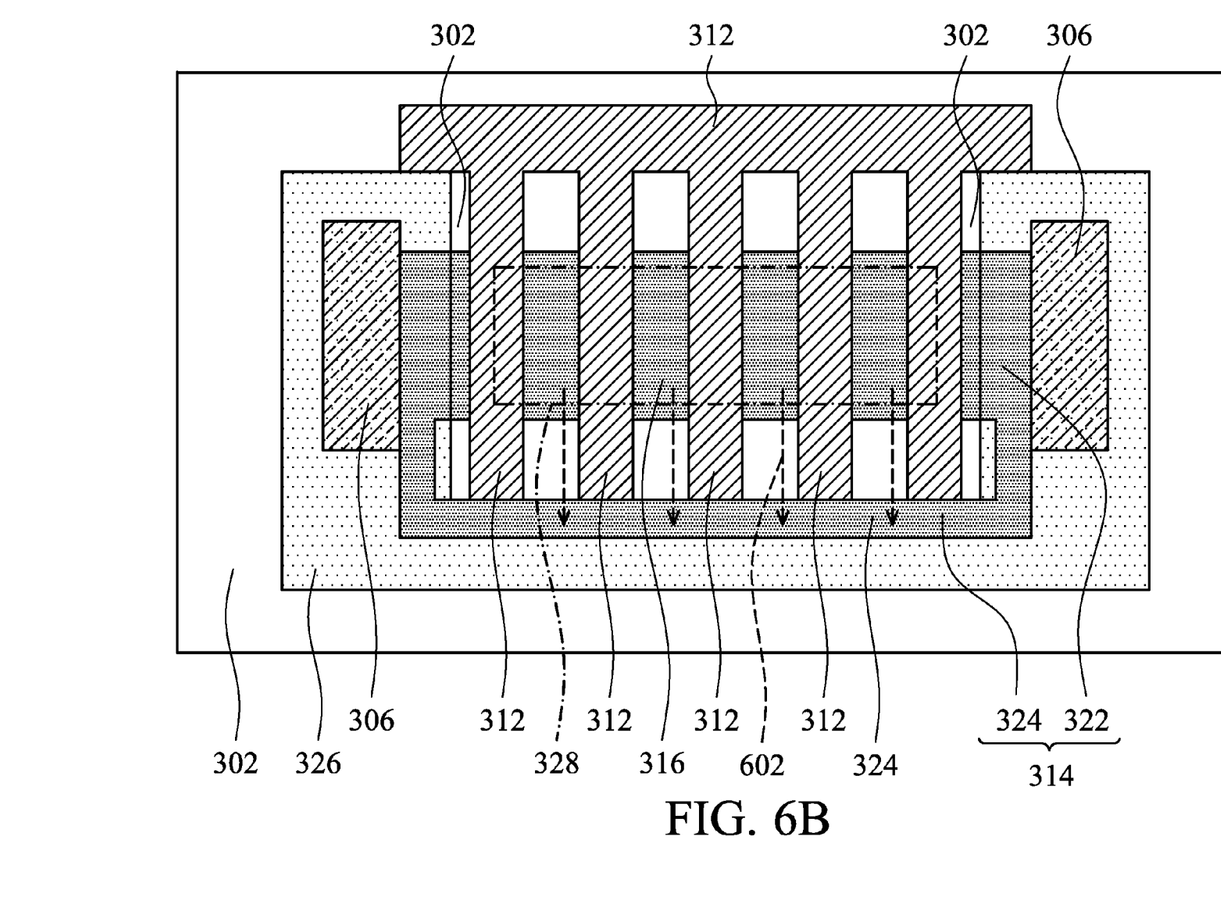

The current flow of the vertical MOSFET ESD device is illustrated in accordance with FIG. 6A and FIG. 6B. Referring to FIG. 6A and FIG. 6B, when an electrostatic discharge event is generated, the current flow 602 can be directed from the drain region 316 and then downward through the ESD implant region 318 and then to the source region 314 for releasing the electrostatic discharge. The drain regions 316, the ESD implant regions 318 and the source region 314 are vertically arranged so that layout area can be reduced to increase integrity. In addition, the vertical MOSFET ESD device can fully turn on the device channel that can operate the device more efficiently when in a turn mode.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A vertical MOSFET electrostatic discharge device, comprising:
a substrate comprising a plurality of trenches;
a recessed gate, wherein the recessed gate is comb-shaped from a top view and comprises a plurality of teeth, and wherein each of the plurality of teeth is disposed in a respective one of the plurality of trenches;
a plurality of drain regions, wherein in each of the plurality of drain regions is disposed between a neighboring two of the teeth, and each of the plurality of drain regions is doped with first type dopants;
a plurality of electrostatic discharge implant regions, wherein each of the plurality of electrostatic discharge implant regions is disposed under a respective one of the plurality of drain regions and comprises a bottom side and a vertical side; and
a source region surrounding and disposed under the plurality of teeth and the plurality of electrostatic discharge implant regions, wherein the source region directly contacts the bottom side of each of the plurality of electrostatic discharge implant regions without contacting the vertical side thereof.

2. The vertical MOSFET electrostatic discharge device as claimed in claim 1, wherein the source region is U-shaped from the top view with a first portion adjacent to a right most and a left most tooth of the comb-shaped structure and a second portion directly contacting each of the teeth of the comb-shaped structure.

3. The vertical MOSFET electrostatic discharge device as claimed in claim 1, further comprising a first trench isolation adjacent to two sides of the source region.

4. The vertical MOSFET electrostatic discharge device as claimed in claim 1, further comprising second trench isolations disposed neighboring opposite ends of each of the drain regions.

5. The vertical MOSFET electrostatic discharge device as claimed in claim 1, further comprising a gate dielectric layer disposed between the plurality of teeth and the substrate.

6. The vertical MOSFET electrostatic discharge device as claimed in claim 5, wherein the gate dielectric layer comprises silicon oxide, silicon nitride, silicon oxynitride, $Ta_2O_5$, $HfO_2$, $HSiO_x$, $Al_2O_3$, $InO_2$, $La_2O_3$, $ZrO_2$, or $TaO_2$.

7. The vertical MOSFET electrostatic discharge device as claimed in claim 1, wherein the source region is doped with first type dopants, the drain regions are doped with first type dopants, and the electrostatic discharge implant regions are doped with second type dopants.

8. The vertical MOSFET electrostatic discharge device as claimed in claim 7, wherein the first type is n type, and the second type is p type.

9. The vertical MOSFET electrostatic discharge device as claimed in claim 1, wherein the first type is p type and the second type is n type.

10. The vertical MOSFET electrostatic discharge device as claimed in claim 1, wherein when an electrostatic discharge event is generated, a current flow can be directed from the drain region and then downward through the electrostatic discharge implant region and then to the source region for releasing the electrostatic discharge.

11. The vertical MOSFET electrostatic discharge device as claimed in claim 1, wherein each of the drain regions is a rectangular-shaped bulk structure having a first side and a second side opposite to the first side, and the first side and the second side directly contact the teeth of the comb-shaped structure.

* * * * *